US012694918B2

(12) United States Patent
Sugiura

(10) Patent No.: US 12,694,918 B2
(45) Date of Patent: Jul. 28, 2026

(54) MAGNETIC MEMORY DEVICE

(71) Applicant: Kioxia Corporation, Tokyo (JP)

(72) Inventor: Kuniaki Sugiura, Seoul (KR)

(73) Assignee: Kioxia Corporation, Tokyo (JP)

( * ) Notice: Subject to any disclaimer, the term of this patent is extended or adjusted under 35 U.S.C. 154(b) by 141 days.

(21) Appl. No.: 18/828,860

(22) Filed: Sep. 9, 2024

(65) Prior Publication Data

US 2025/0292818 A1     Sep. 18, 2025

(30) Foreign Application Priority Data

Mar. 14, 2024     (JP) ................................. 2024-040284

(51) Int. Cl.
  *G11C 11/16*          (2006.01)
(52) U.S. Cl.
  CPC ................................. *G11C 11/1673* (2013.01)
(58) Field of Classification Search
  CPC .............. G11C 11/1673; G11C 11/161; G11C
    11/1655; G11C 11/1657; G11C 11/1659;
    G11C 11/1675; G11C 11/1693; G11C
    11/1697; H10N 50/10; H10N 50/85;
    H10B 61/22
  See application file for complete search history.

(56) References Cited

U.S. PATENT DOCUMENTS

| | | | |
|---|---|---|---|
| 7,505,334 B1 * | 3/2009 | Breitwisch | .......... G11C 11/5607 |
| | | | 365/158 |
| 2002/0031032 A1 | 3/2002 | Ooishi | |
| 2009/0073785 A1 * | 3/2009 | Breitwisch | ......... G11C 13/0002 |
| | | | 365/189.011 |
| 2018/0144782 A1 | 5/2018 | Noguchi et al. | |
| 2018/0342273 A1 | 11/2018 | Al-Shamma et al. | |
| 2021/0027829 A1 | 1/2021 | Kim et al. | |
| 2023/0061840 A1 | 3/2023 | Ang et al. | |

* cited by examiner

*Primary Examiner* — Jay W. Radke
(74) *Attorney, Agent, or Firm* — Holtz, Holtz & Volek PC

(57)          ABSTRACT

According to one embodiment, a magnetic memory device includes a memory cell, a first power supply circuit, first, second and third switches, a comparator, a delay circuit and a sense amplifier. The memory cell includes a variable resistance element and a selector element. The first power supply circuit supplies the memory cell with a first voltage. The first switch is coupled between the memory cell and the first power supply circuit. The second switch is coupled between the memory cell and a ground voltage node. The comparator compares a voltage of the memory cell with a second voltage lower than the first voltage, and to output a first signal when the voltage of the memory cell drops below the second voltage. The delay circuit delays the first signal output from the comparator by a first delay time and to output a second signal.

18 Claims, 12 Drawing Sheets

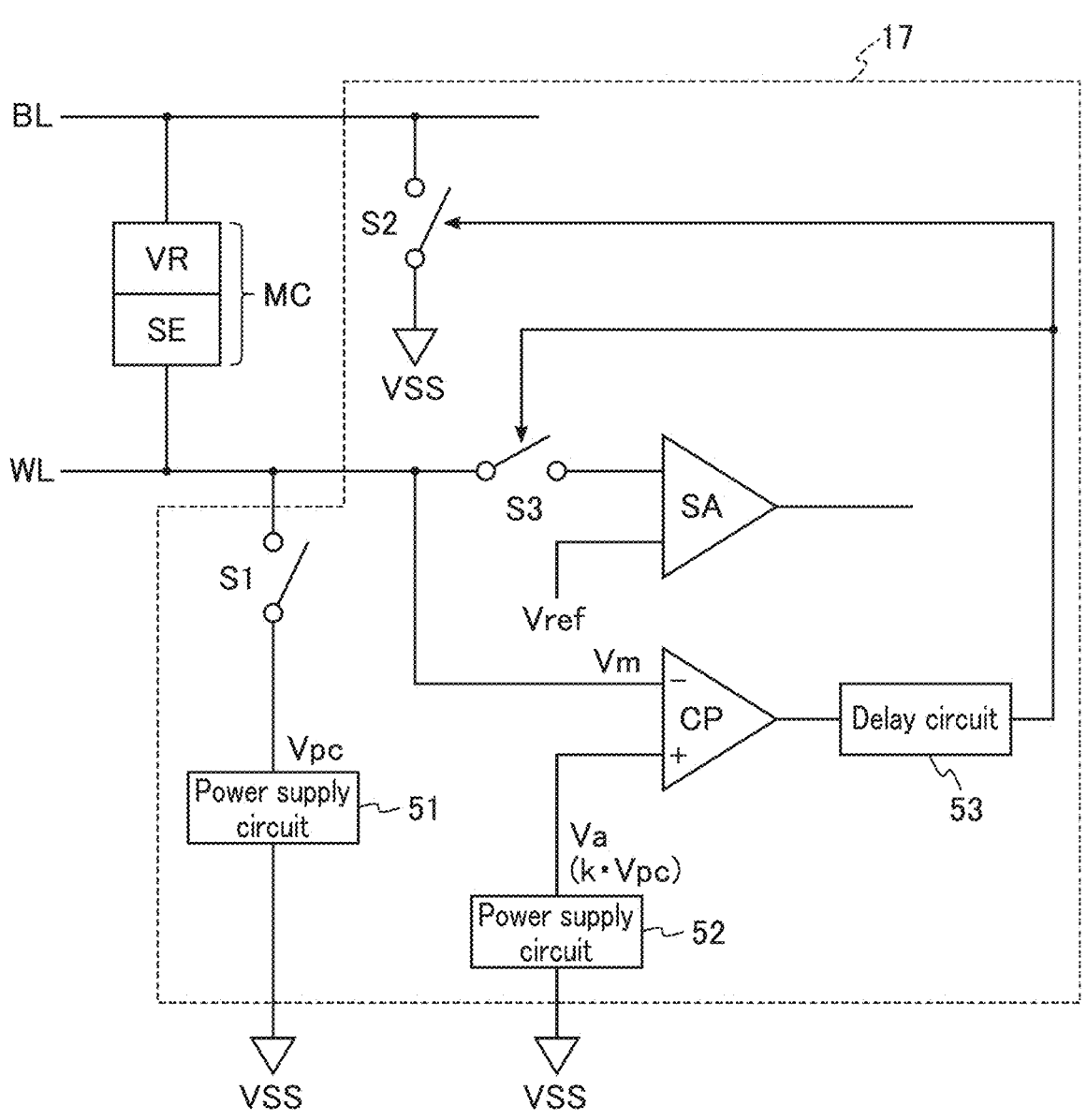
F I G. 5

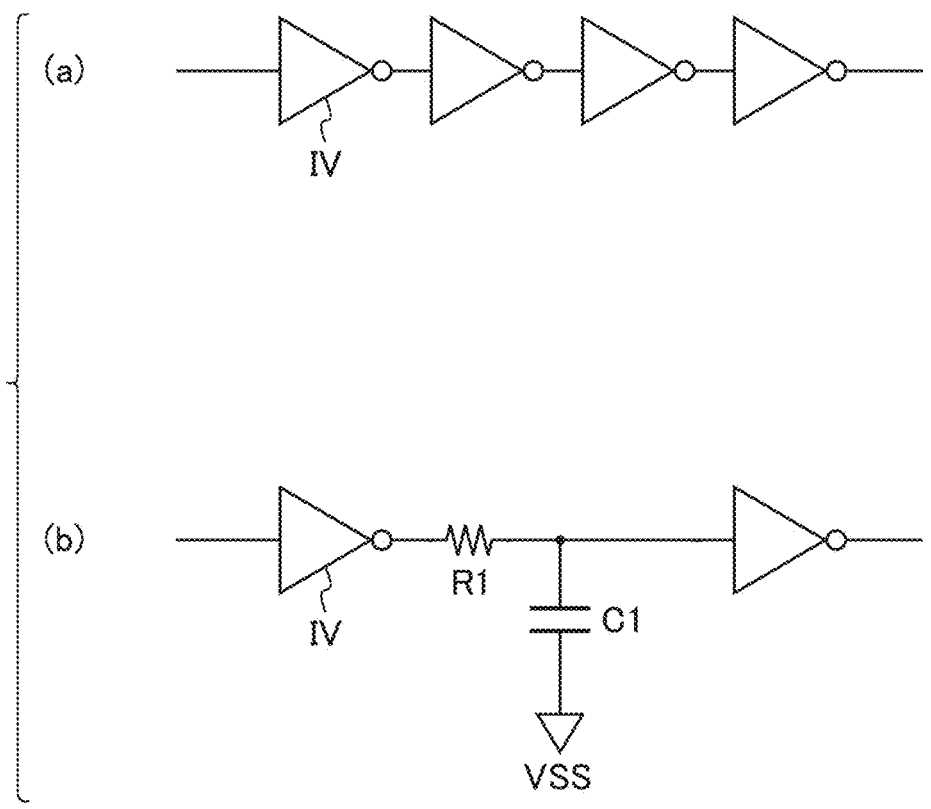
F I G. 6

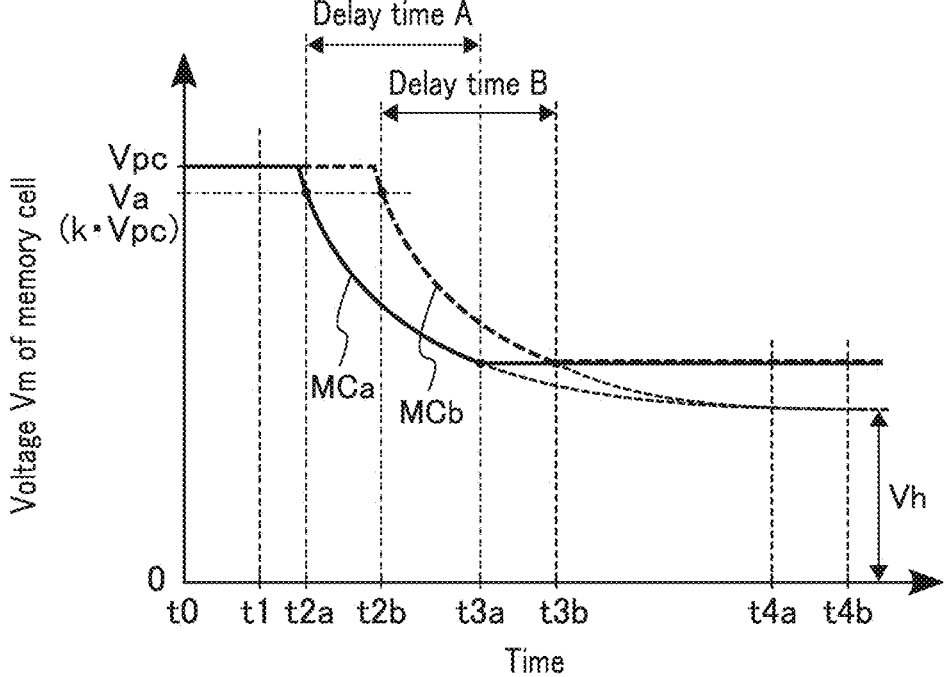
F I G. 7

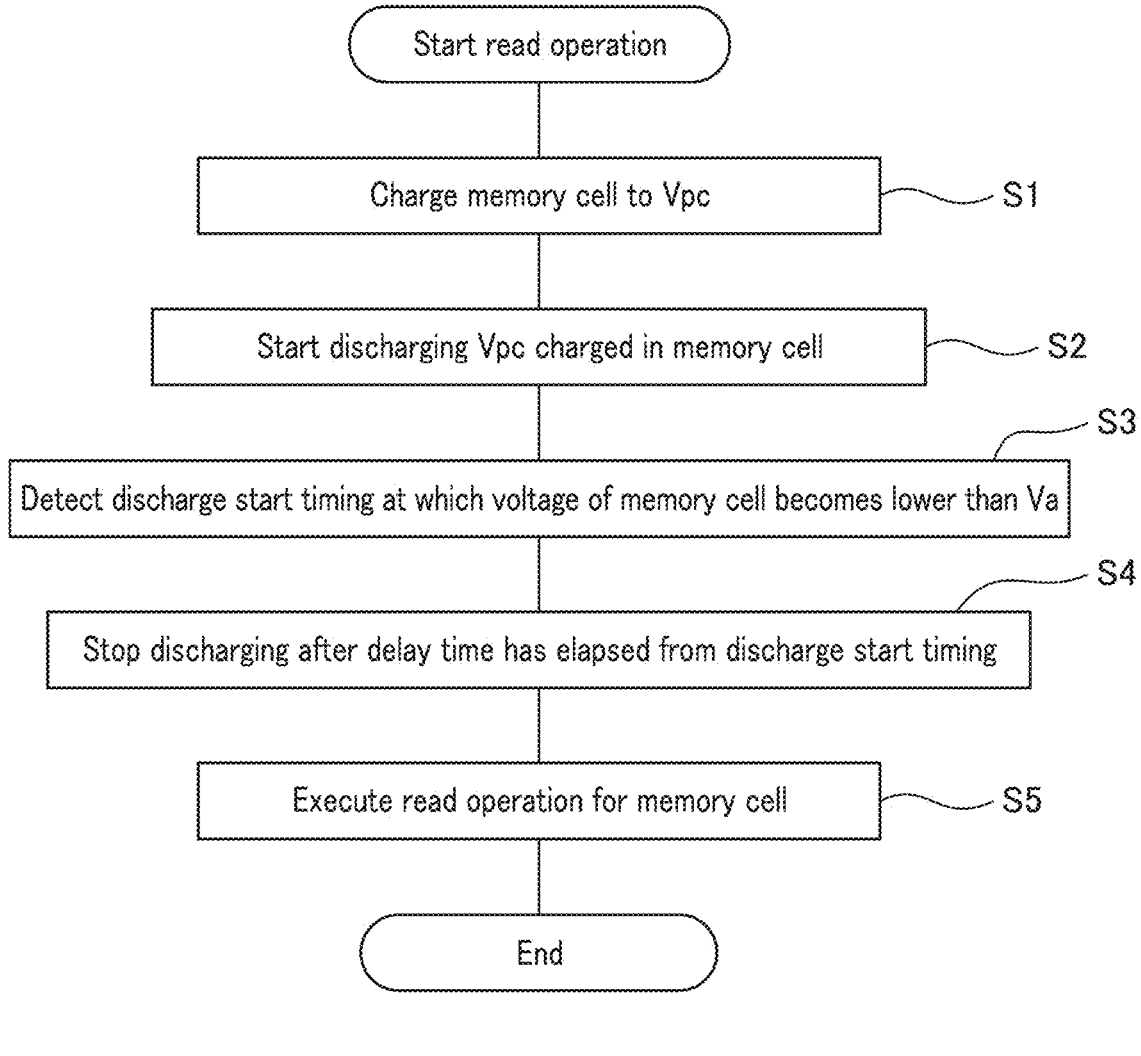
Start read operation
Charge memory cell to Vpc — S1
Start discharging Vpc charged in memory cell — S2
Detect discharge start timing at which voltage of memory cell becomes lower than Va — S3
Stop discharging after delay time has elapsed from discharge start timing — S4
Execute read operation for memory cell — S5
End
F I G. 8

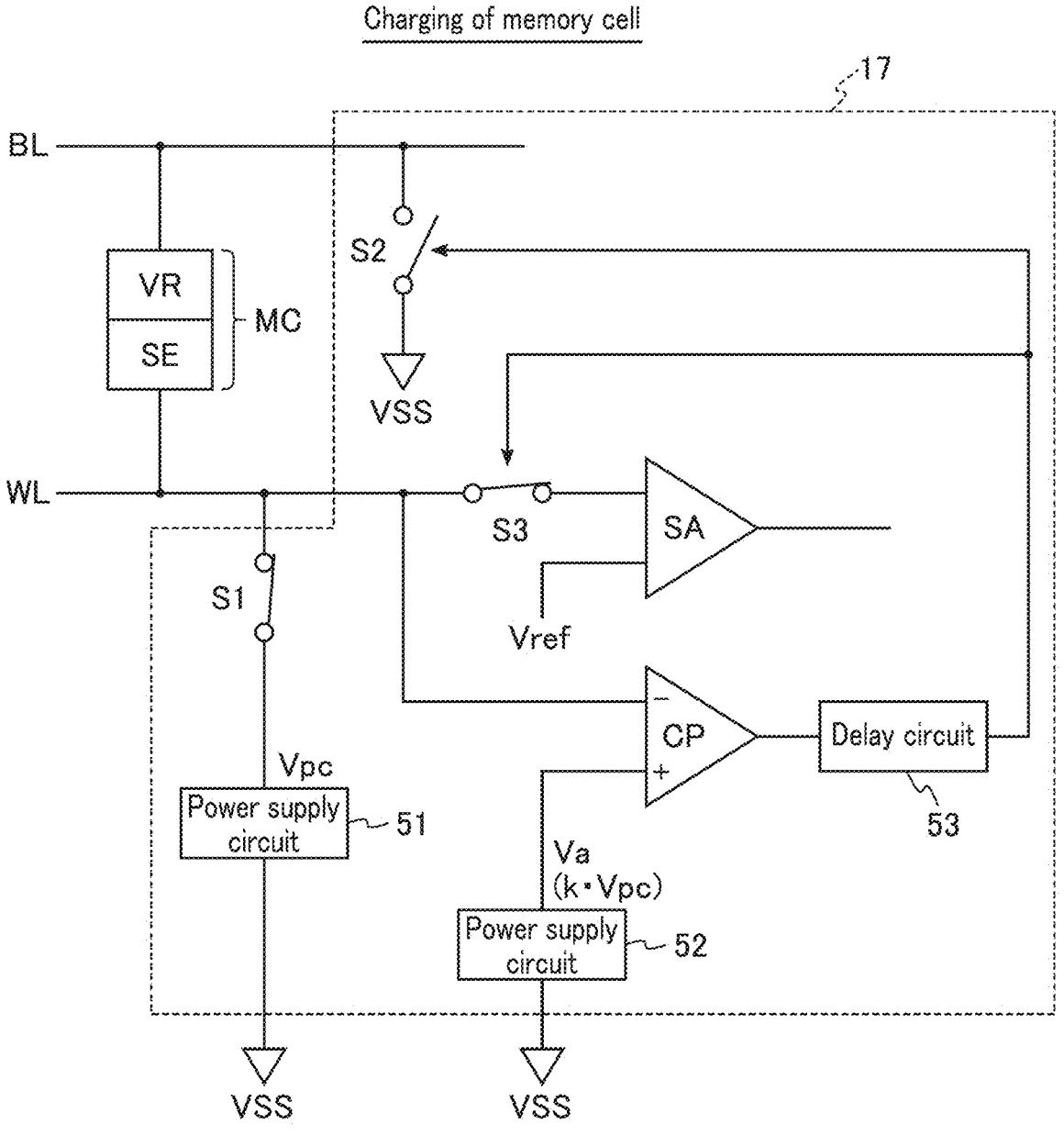
F I G. 9

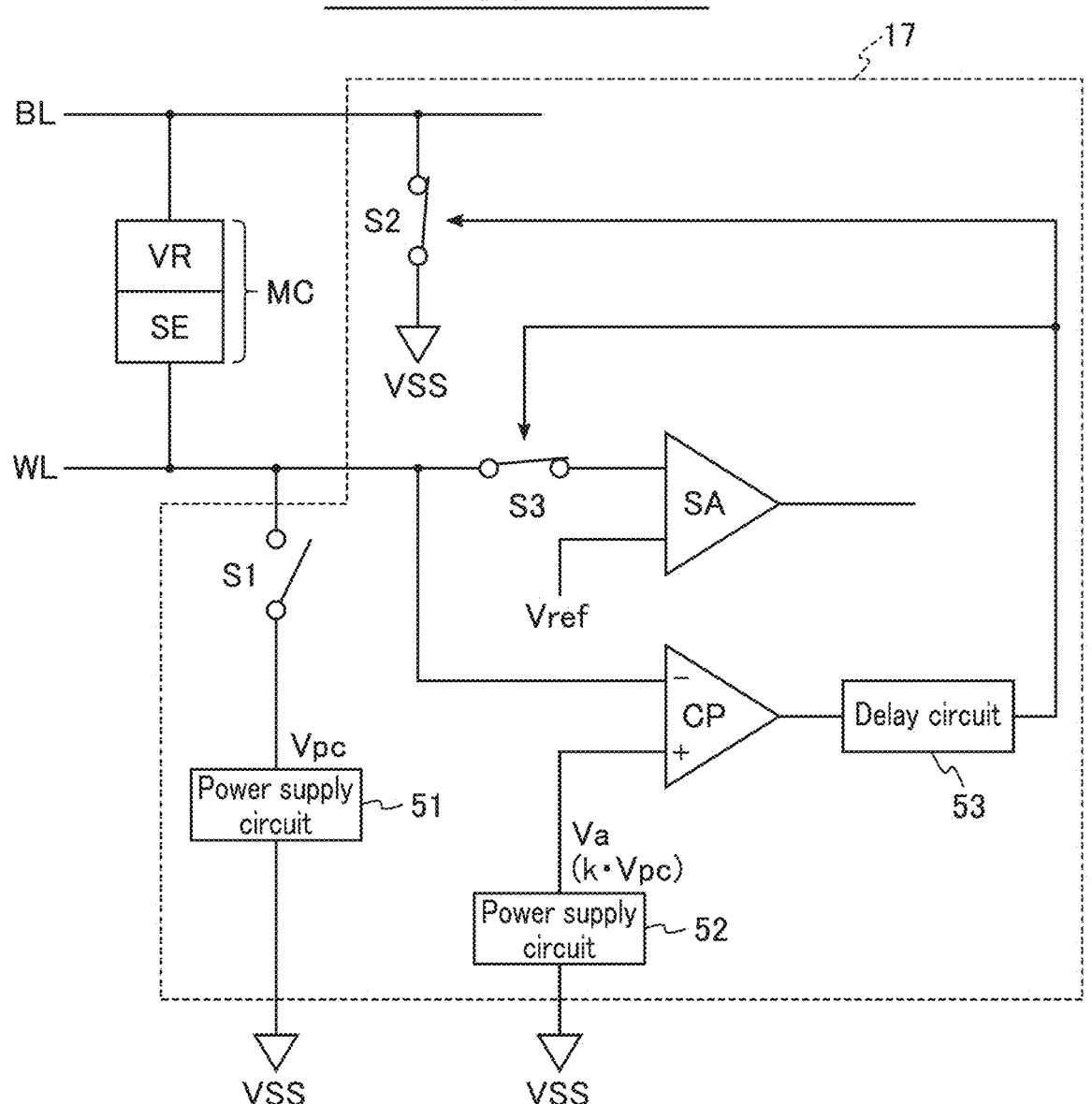
F I G. 10

Detect start of discharging

FIG. 11

MAGNETIC MEMORY DEVICE

CROSS-REFERENCE TO RELATED APPLICATIONS

This application is based upon and claims the benefit of priority from Japanese Patent Application No. 2024-040284, filed Mar. 14, 2024, the entire contents of which are incorporated herein by reference.

FIELD

Embodiments described herein relate generally to a magnetic memory device.

BACKGROUND

There is known a magnetic memory device (e.g., MRAM: magnetoresistive random access memory) that uses a magnetoresistance effect element as a memory element.

BRIEF DESCRIPTION OF THE DRAWINGS

FIG. 5 is a circuit diagram showing the configuration of a read circuit provided in the magnetic memory device according to the embodiment.

FIG. 6 is a diagram showing an example configuration of a delay circuit provided in the read circuit according to the embodiment.

FIG. 7 is a diagram showing changes in voltage of a memory cell during a read operation of the magnetic memory device according to the embodiment.

FIG. 8 is a flowchart showing the flow of the read operation performed in the magnetic memory device according to the embodiment.

FIG. 9 to FIG. 12 are diagrams showing the states of switches and the flow of current during the read operation according to the embodiment.

DETAILED DESCRIPTION

In general, according to one embodiment, a magnetic memory device includes a memory cell, a first power supply circuit, a first switch, a second switch, a comparator, a delay circuit, a sense amplifier, and a third switch. The memory cell includes a variable resistance element and a selector element. The first power supply circuit is configured to supply the memory cell with a first voltage. The first switch is coupled between the memory cell and the first power supply circuit and that sets the memory cell and the first power supply circuit to either a coupled state or a decoupled state. The second switch is coupled between the memory cell and a ground voltage node to which a ground voltage is supplied, and that sets the memory cell and the ground voltage node to either a coupled state or a decoupled state. The comparator is configured to compare a voltage of the memory cell with a second voltage lower than the first voltage, and to output a first signal when the voltage of the memory cell drops below the second voltage. The delay circuit is configured to delay the first signal output from the comparator by a first delay time and to output a second signal. The sense amplifier is configured to compare the voltage of the memory cell with a third voltage. The third switch is coupled between the memory cell and the sense amplifier and sets the memory cell and the sense amplifier to either a coupled state or a decoupled state. During a read operation, the first switch is set to a coupled state, the second switch is set to a decoupled state, and the memory cell is charged to the first voltage. After the memory cell is charged to the first voltage, the first switch is set to a decoupled state, the second switch is set to a coupled state, and charge stored in the memory cell is discharged. In response to the second signal, the third switch is set to a decoupled state, and the sense amplifier compares the voltage of the memory cell with the third voltage to determine data stored in the memory cell.

Embodiments will be described with reference to the accompanying drawings. In the descriptions below, structural elements having similar functions and configurations will be denoted by the same reference symbols. The embodiments described below merely show an exemplary apparatus and method that implement the technical ideas of the embodiments. The technical ideas are not limited to the element materials, shapes, structures, arrangements etc. described below.

Embodiments

Figure 1:
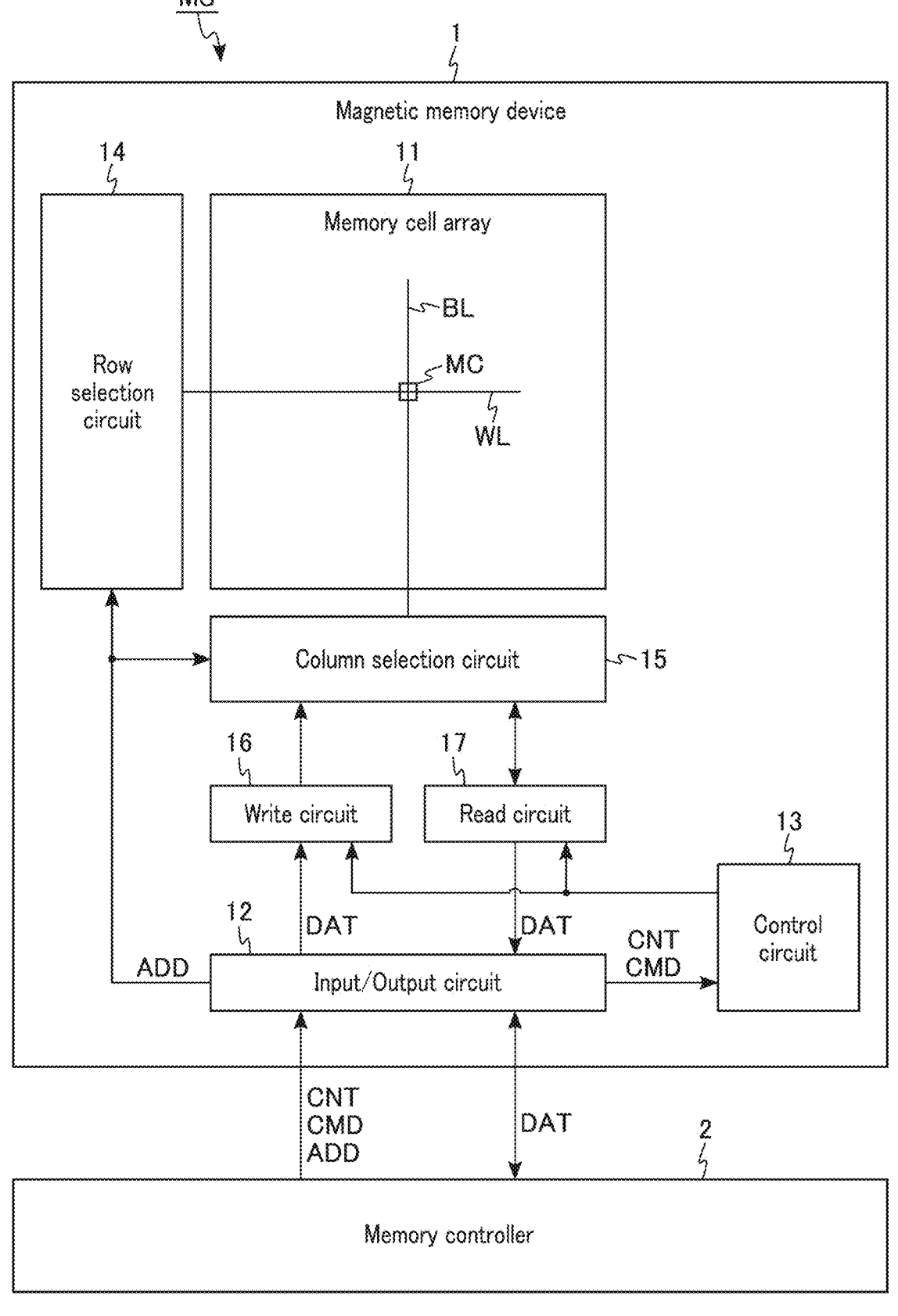
FIG. 1 is a block diagram showing the configuration of a memory system including a magnetic memory device according to an embodiment.

First, an example of a memory system including a magnetic memory device of an embodiment will be described. FIG. 1 is a block diagram showing the configuration of the memory system MS including the magnetic memory device of the embodiment.

As shown in FIG. 1, the memory system MS includes a magnetic memory device 1 and a memory controller 2. The magnetic memory device 1 operates under the control of the memory controller 2. The memory controller 2 can instruct the magnetic memory device 1 to perform a read operation, a write operation, etc. in response to a request (or a command) from an external host device.

1. Configuration of Magnetic Memory Device

Next, the configuration of the magnetic memory device 1 of the embodiment will be described with reference to FIG. 1.

The magnetic memory device 1 is a type of resistance change memory. The magnetic memory device 1 is a memory device that uses magnetic tunnel junction (MTJ) elements as memory cells. The MTJ elements utilize the magnetoresistance effect caused by a magnetic tunnel junction. The MTJ elements are referred to as magnetoresistance effect elements as well.

The magnetic memory device 1 includes, for example, a memory cell array 11, an input/output circuit 12, a control circuit 13, a row selection circuit 14, a column selection circuit 15, a write circuit 16, and a read circuit 17.

The memory cell array 11 includes a plurality of memory cells MC, a plurality of word lines WL, and a plurality of bit lines BL. FIG. 1 shows one set of a memory cell MC, a word line WL, and a bit line BL. The memory cells MC can store data in a nonvolatile manner. Each memory cell MC is coupled between one word line WL and one bit line BL, and is associated with a pair consisting of a row and a column. A row address is assigned to the word line WL. A column address is assigned to the bit line BL. One or more memory cells MC can be specified by selecting one row and one or more columns.

The input/output circuit 12 is coupled to the memory controller 2 and controls communications between the magnetic memory device 1 and the memory controller 2. The input/output circuit 12 transfers a control signal CNT and a command CMD, received from the memory controller 2, to the control circuit 13. Also, the input/output circuit 12 transfers a row address and a column address, included in an address signal ADD received from the memory controller 2, to the row selection circuit 14 and the column selection circuit 15, respectively. The input/output circuit 12 transfers data DAT (write data), received from the memory controller 2, to the write circuit 16. The input/output circuit 12 transfers data DAT (read data), received from the read circuit 17, to the memory controller 2.

The control circuit 13 controls the overall operation of the magnetic memory device 1. For example, the control circuit 13 executes a read operation, a write operation, etc., based on the control indicated by the control signal CNT and the command CMD. For example, in a write operation, the control circuit 13 supplies the write circuit 16 with a voltage and a control signal used for data write. In addition, in a read operation, the control circuit 13 supplies the read circuit 17 with a voltage and a control signal used for data read.

The row selection circuit 14 is coupled to a plurality of word lines WL. The row selection circuit 14 selects one word line WL specified by a row address. The selected word line WL is electrically coupled, for example, to a driver circuit (not shown).

The column selection circuit 15 is coupled to a plurality of bit lines BL. The column selection circuit 15 selects one or more bit lines BL specified by a column address. The selected bit lines BL are electrically coupled, for example, to a driver circuit (not shown).

The write circuit 16 supplies the column selection circuit 15 with a voltage used for data write, under the control of the control circuit 13 and based on the data DAT (write data) received from the input/output circuit 12. In a case where a current based on the write data flows through the memory cell MC, a desired data is written to the memory cell MC.

The read circuit 17 includes a sense amplifier. The read circuit 17 supplies the row selection circuit 14 and the column selection circuit 15 with a voltage used for data read under the control of the control circuit 13. The sense amplifier determines the data stored in the memory cell MC, based on the voltage or current of the selected memory cell MC and word line WL. Furthermore, the read circuit 17 transfers data DAT (read data) corresponding to the determination result to the input/output circuit 12. Details of the read circuit 17 will be described later.

1.1 Circuit Configuration of Memory Cell Array

Figure 2:
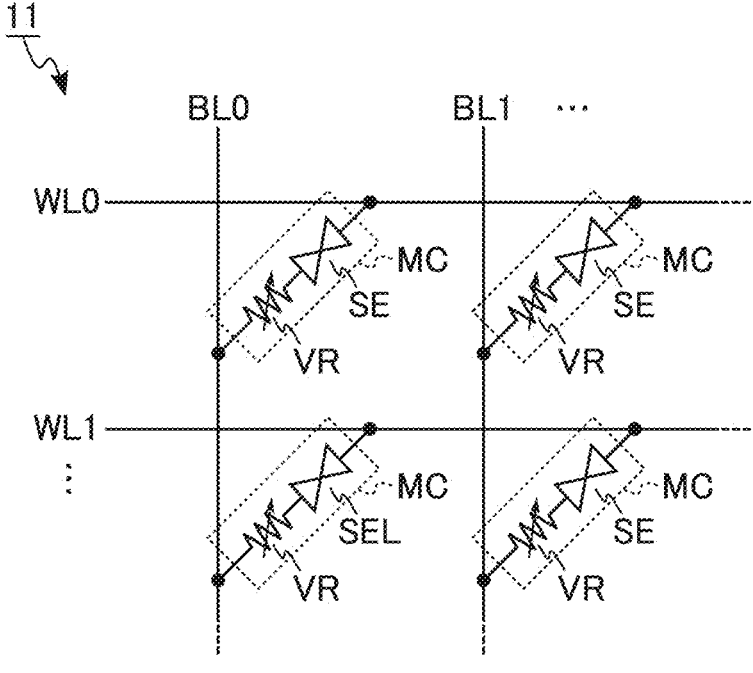
FIG. 2 is a circuit diagram showing the configuration of a memory cell array provided in the magnetic memory device according to the embodiment.

An example of the circuit configuration of the memory cell array 11 included in the magnetic memory device 1 of the embodiment will be described with reference to FIG. 2. FIG. 2 is a circuit diagram showing the configuration of the memory cell array 11 included in the magnetic memory device 1. FIG. 2 shows WL0 and WL1 of the plurality of word lines WL, and BL0 and BL1 of the plurality of bit lines BL.

As shown in FIG. 2, one memory cell MC is coupled between WL0 and BL0, between WL0 and BL1, between WL1 and BL0, and between WL1 and BL1. The plurality of memory cells MC are arranged, for example, in a matrix pattern in the memory cell array 11.

Each memory cell MC includes a variable resistance element VR and a selector element SE. The variable resistance element VR and the selector element SE are coupled in series between the associated bit line BL and word line WL. For example, one end of the variable resistance element VR is coupled to the bit line BL. The other end of the variable resistance element VR is coupled to one end of the selector element SE. The other end of the selector element SE is coupled to the word line WL. The coupling relationship of the variable resistance element VR and the selector element SE may be reversed between the bit line BL and the word line WL. That is, one end of the variable resistance element VR is coupled to the word line WL, and the other end of the variable resistance element VR is coupled to one end of the selector element SE. The other end of the selector element SE may be coupled to the bit line BL.

The variable resistance element VR corresponds to an MTJ element (i.e., a magnetoresistance effect element). The variable resistance element VR can store data in a nonvolatile manner, based on the resistance value thereof. For example, a memory cell MC including a variable resistance element VR in a high resistance state stores data "1." A memory cell MC including a variable resistance element VR in a low resistance state stores data "0." The assignment of data associated with the resistance value of the variable resistance element VR may be set in a different way. The resistance state of the variable resistance element VR can change depending on the current flowing through the variable resistance element VR.

The selector element SE is, for example, a bidirectional diode. The selector element SE functions as a selector that controls the supply of current to the associated variable resistance element VR. Specifically, the selector element SE included in a certain memory cell MC is in the off state in a case where the voltage applied to the memory cell MC is lower than the threshold voltage of the selector element SE, and is in the on state in a case where that voltage is equal to or higher than the threshold voltage of the selector element SE. The selector element SE in the off state functions as an insulator having a high resistance value. In a case where the selector element SE is in the off state, the flow of current is suppressed between the word line WL and bit line BL coupled to the memory cell MC. The selector element SE in the on state functions as a conductor having a low resistance value. In a case where the selector element SE is in the on state, a current flows between the word line WL and bit line BL coupled to the memory cell MC. In other words, the selector element SE can switch whether or not to permit the flow of a current depending on the magnitude of the voltage applied to the memory cell MC, regardless of the direction in which the current flows. It should be noted that another element such as a transistor may be used as the selector element SE.

1.2 Structure of Memory Cell Array

Figure 3:
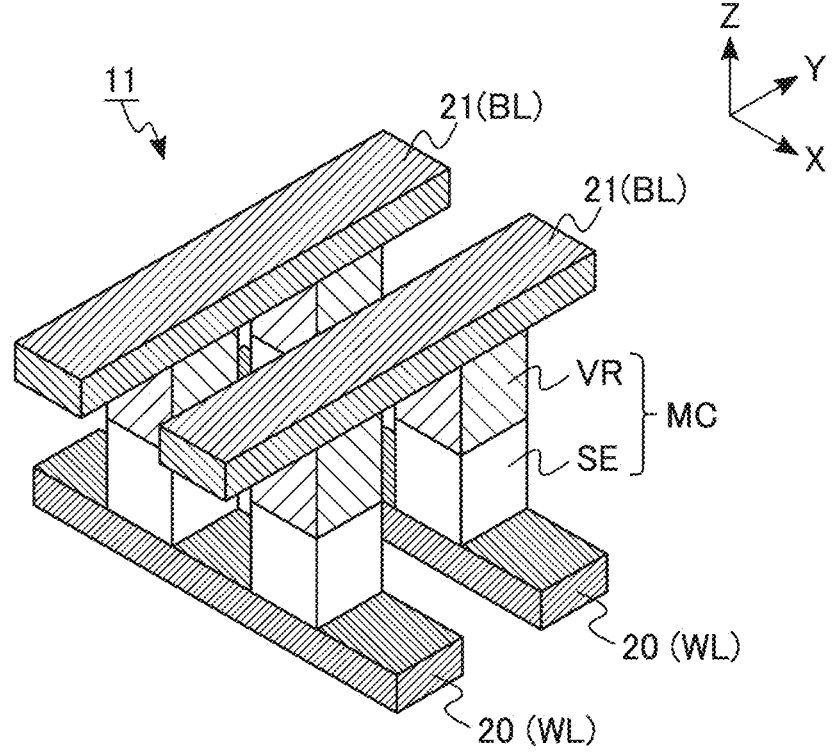
FIG. 3 is a perspective view showing the structure of the memory cell array provided in the magnetic memory device according to the embodiment.

An example of the structure of the memory cell array 11 included in the magnetic memory device 1 of the embodiment will be described with reference to FIG. 3. FIG. 3 is a perspective view showing the structure of the memory cell array 11 included in the magnetic memory device 1. In the description below, an XYZ orthogonal coordinate system is used. The X direction corresponds to the direction in which the word line WL extends. The Y direction corresponds to the direction in which the bit line BL extends. The Z direction corresponds to the direction vertical to the surface of the semiconductor substrate used to form the magnetic memory device 1. The term "down" and its derivatives and related words indicate a position of a smaller coordinate on the Z axis. The term "up" and its derivatives and related words indicate a position of a larger coordinate on the Z axis. Hatching is added to the perspective view where appropriate. The hatching added to the perspective view is not necessarily related to the materials or characteristics of the hatched component. In the perspective views and cross-sectional views, illustration of configurations such as interlayer insulating films is omitted.

As shown in FIG. 3, the memory cell array 11 includes a plurality of conductive layers 20, a plurality of conductive layers 21, and a plurality of memory cells MC.

Each of the plurality of conductive layers 20 has a portion extending in the X direction. The plurality of conductive layers 20 are arranged side by side in the Y direction and are spaced apart from each other. Each of the conductive layers 20 is used as a word line WL.

Each of the plurality of conductive layers 21 has a portion extending in the Y direction. The plurality of conductive layers 21 are arranged side by side in the X direction and are spaced apart from each other. Each of the conductive layers 21 is used as a bit line BL.

An interconnect layer including the plurality of conductive layers 21 is provided above an interconnect layer including the plurality of conductive layers 20. One memory cell MC is provided at each of the intersections between the plurality of conductive layers 20 and the plurality of conductive layers 21. In other words, each memory cell MC is provided between the associated word line WL and bit line BL. Each memory cell MC has a columnar structure. In this example, a selector element SE is provided on the conductive layer 20. A variable resistance element VR is provided on the selector element SE. A conductive layer 21 is provided on the variable resistance element VR.

Although the example has been given of the case where the variable resistance element VR is provided above the selector element SE, this is not restrictive. Depending on the circuit configuration of the memory cell array 11, the variable resistance element VR may be provided below the selector element SE. Furthermore, other elements or conductive layers may be inserted between the memory cell MC and the conductive layer 20. Similarly, other elements or conductive layers may be inserted between the memory cell MC and the conductive layer 21. Each of the conductive layers 20 and 21 may be referred to as an "interconnect."

1.3 Cross-Sectional Structure of Memory Cell

Figure 4:
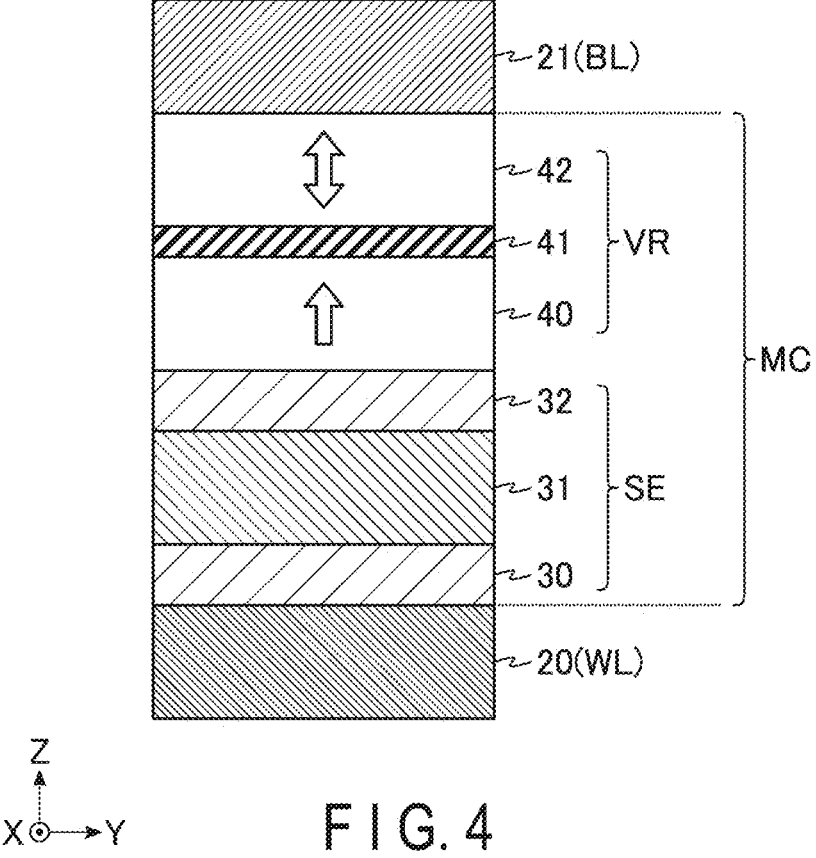
FIG. 4 is a cross-sectional view of a memory cell in the memory cell array according to the embodiment.

An example of a memory cell MC included in the memory cell array 11 of the magnetic memory device 1 of the embodiment will be described with reference to FIG. 4. FIG. 4 is a cross-sectional view of the memory cell MC included in the memory cell array 11.

As shown in FIG. 4, the memory cell MC has a structure in which a lower electrode 30, a selector material layer 31, an upper electrode 32, a ferromagnetic layer 40, a non-magnetic layer 41, and a ferromagnetic layer 42 are stacked on the conductive layer 20 in this order upward (Z direction).

That is, the lower electrode 30 is provided above the conductive layer 20 (Z direction). The selector material layer 31 is provided above the lower electrode 30. The upper electrode 32 is provided above the selector material layer 31. The ferromagnetic layer 40 is provided above the upper electrode 32. The non-magnetic layer 41 is provided above the ferromagnetic layer 40. The ferromagnetic layer 42 is provided above the non-magnetic layer 41. The conductive layer 21 is provided above the ferromagnetic layer 42.

In other words, the non-magnetic layer 41 is provided between the ferromagnetic layer 40 and the ferromagnetic layer 42. The ferromagnetic layer 40 is provided between the non-magnetic layer 41 and the upper electrode 32. The upper electrode 32 is provided between the ferromagnetic layer 40 and the selector material layer 31. The selector material layer 31 is provided between the upper electrode 32 and the lower electrode 30. The lower electrode 30 is provided between the selector material layer 31 and the conductive layer 20. Furthermore, the ferromagnetic layer 42 is provided between the non-magnetic layer 41 and the conductive layer 21.

The set consisting of the lower electrode 30, the selector material layer 31, and the upper electrode 32 corresponds to the selector element SE. The set consisting of the ferromagnetic layer 40, the non-magnetic layer 41 and the ferromagnetic layer 42 corresponds to the variable resistance element VR.

Each of the ferromagnetic layers 40 and 42 is made of a ferromagnetic material and has a magnetization direction perpendicular to the film surface. For example, in the magnetic memory device 1, the magnetization direction of the ferromagnetic layer 40 is fixed, and the magnetization direction of the ferromagnetic layer 42 is variable. In this case, the ferromagnetic layer 40 functions as a reference layer of the MTJ element, and the ferromagnetic layer 42 functions as a storage layer of the MTJ element. The non-magnetic layer 41 is made of an insulator such as MgO and functions as a tunnel barrier layer. The ferromagnetic layers 40 and 42 form a magnetic tunnel junction together with the non-magnetic layer 41. Such a variable resistance element VR functions as a perpendicular magnetization type MTJ element utilizing the tunneling magnetoresistive (TMR) effect.

The ferromagnetic layer 40 contains at least one element selected from the group consisting of iron (Fe), cobalt (Co), and nickel (Ni). The non-magnetic layer contains at least one element, or an oxide of a compound thereof, selected from the group consisting of magnesium (Mg), aluminum (Al), zinc (Zn), titanium (Ti), and LSM (lanthanum-strontium-manganese). The ferromagnetic layer 42 contains at least one element selected from the group consisting of iron (Fe), cobalt (Co), and nickel (Ni).

The variable resistance element VR can be in either a low resistance state or a high resistance state, depending on the relative relationship between the magnetization directions of the ferromagnetic layers 40 and 42. The variable resistance element VR stores data in accordance with the magnetization direction of the ferromagnetic layer 42 (storage layer). For example, the variable resistance element VR in which the magnetization directions of the reference layer and the storage layer are antiparallel (AP state) is in a high resistance state (data "1"). On the other hand, the variable resistance element VR in which the magnetization directions of the reference layer and the storage layer are parallel (P state) is in a low resistance state (data "0").

In this example, the variable resistance element VR is in the AP state in a case where a write current flows from the ferromagnetic layer 40 to the ferromagnetic layer 42, and is in the P state in a case where a write current flows from the ferromagnetic layer 42 to the ferromagnetic layer 40. A write method in which a spin torque is injected into the storage layer and the reference layer by causing a write current to flow through the variable resistance element VR in the above manner and the magnetization direction of the storage layer is controlled thereby is referred to as a spin transfer torque writing method. The variable resistance element VR is configured such that the magnetization direction of the ferromagnetic layer 40 does not change in a case where a current of a magnitude capable of reversing the magnetization direction of the ferromagnetic layer 42 is made to flow through the variable resistance element VR.

In the present specification, the phrase "magnetization direction is variable" is intended to mean that the magnetization direction varies depending on the write current. The phrase "magnetization direction is fixed" is intended to refer to the state where the magnetization direction does not vary due to the write current. In the variable resistance element VR, the arrangement of the storage layer and the reference layer may be interchanged. The variable resistance element VR may also include other layers. For example, the variable resistance element VR may include a shift canceling layer that suppresses the influence of a leakage magnetic field from the reference layer, or have a synthetic anti-ferromagnetic (SAF) structure. In the description below, a memory cell MC including a variable resistance element VR in the AP state will be referred to as a memory cell MC in the AP state, and a memory cell MC including a variable resistance element VR in the P state will be referred to as a memory cell MC in the P state.

1.4 Circuit Configuration of Read Circuit

An example of the circuit configuration of the read circuit 17 included in the magnetic memory device 1 of the embodiment will be described with reference to FIG. 5. FIG. 5 is a circuit diagram showing the configuration of the read circuit 17. FIG. 5 shows the read circuit 17, a pair consisting of bit line BL and word line WL included in the memory cell array 11, and a memory cell MC.

As shown in FIG. 5, the read circuit 17 includes a sense amplifier SA, a comparator CP, a power supply circuit 51, a power supply circuit 52, a delay circuit 53, a precharge switch S1, a sink switch S2, and a sense amplifier switch S3.

The power supply circuit 51 is coupled to the word line WL via the precharge switch S1. The power supply circuit 51 is coupled to a node to which a ground voltage VSS is supplied. In the description below, the node to which the ground voltage VSS is supplied will be referred to as a ground voltage VSS node.

The word line WL is coupled to the sense amplifier SA via the sense amplifier switch S3. The sense amplifier SA is supplied with a reference voltage Vref.

The word line WL is coupled to the negative input terminal (or inverting input terminal) of the comparator CP. The power supply circuit 52 is coupled to the positive input terminal (or non-inverting input terminal) of the comparator CP. A ground voltage VSS node is coupled to the power supply circuit 52.

The output terminal of the comparator CP is coupled to an input terminal of the delay circuit 53. The output terminal of the delay circuit 53 is coupled to a control terminal of the sink switch S2 and a control terminal of the sense amplifier switch S3.

The bit line BL is coupled to the ground voltage VSS node via the sink switch S2.

The memory cell MC is coupled between the word line WL and the bit line BL. The memory cell MC includes a selector element SE and a variable resistance element VR coupled in series. That is, one end of the selector element SE is coupled to the word line WL, and one end of the variable resistance element VR is coupled to the other end of the selector element SE. Furthermore, the bit line BL is coupled to the other end of the variable resistance element VR.

The sense amplifier SA is configured to compare the voltage Vm of the memory cell MC with a reference voltage Vref when data stored in the memory cell MC is read, and to determine the data stored in the memory cell MC, based on the comparison result. It should be noted that the voltage Vm of the memory cell MC can be considered, for example, to be a voltage generated due to the charge stored in the memory cell MC (or the selector element), or to be a voltage generated due to the charge stored in the memory cell MC (or the selector element) and the word line WL. Either voltage will be hereinafter referred to as the voltage of the memory cell MC.

The reference voltage Vref is a voltage that is used as a threshold in determining whether data is "0" or "1." For example, in a case where the voltage Vm of the memory cell MC is equal to or higher than Vref, the sense amplifier SA outputs a voltage corresponding to data "1." On the other hand, in a case where the voltage Vm of the memory cell MC is lower than Vref, the sense amplifier SA outputs a voltage corresponding to data "0." The sense amplifier SA is provided, for example, for each word line WL.

In a read operation, the comparator CP is configured to compare the voltage Vm of the memory cell MC with a comparison voltage Va, and determine the timing at which discharge from the memory cell MC starts (hereinafter referred to as discharge start timing), based on the comparison result. The comparison voltage Va is a voltage that is used as a threshold in determining the discharge start timing. For example, in a case where the voltage Vm of the memory cell MC is equal to or higher than Va, the comparator CP outputs a signal indicating that discharge has not started, for example, a low-level voltage (hereinafter referred to as "L"). On the other hand, in a case where the voltage Vm of the memory cell MC is less than Va, the comparator CP outputs a signal indicating that discharge has started, i.e., that the present time is the discharge start timing, for example, a high-level voltage higher than "L" (hereinafter referred to as "H"). The comparator CP is provided, for example, for each word line WL.

The power supply circuit 51 supplies the memory cell MC with a precharge voltage Vpc and charges the memory cell MC, i.e., the selector element SE and the word line WL, to a precharge voltage Vpc. The precharge voltage Vpc is a voltage that is charged to the memory cell MC during a read operation.

The power supply circuit 52 supplies the comparator CP with the comparison voltage Va. The comparison voltage Va is lower than the precharge voltage Vpc and is as close as possible to the precharge voltage Vpc. That is, $Va=k \cdot Vpc$, where $k<1$ and k is as close as possible to 1.

After the memory cell MC is charged to the precharge voltage Vpc, the charge stored in the memory cell MC is discharged, and the voltage held by the memory cell MC when the discharge current stops flowing is set as the hold voltage Vh. Thus, $Vpc>Va>Vh$ holds for the comparison voltage Va.

The delay circuit 53 outputs an input voltage with a delay of a predetermined delay time. FIG. 6 is a diagram showing an example of the configuration of the delay circuit 53. For example, as shown in FIG. 6(a), the delay circuit 53 has a configuration in which an even number of inverters IV are coupled in series. As shown in FIG. 6(b), the delay circuit 53 has a configuration including two inverters IV, and a resistive element R1 and a capacitive element C1 that are coupled between the inverters.

The delay time provided by the delay circuit 53 is set to be shorter than the duration from the discharge start timing of the memory cell MC until the memory cell MC drops to the hold voltage Vh due to the discharge.

The delay time provided by the delay circuit 53 is set to be three times or less than the time constant expressed by RC, where R is a resistance component of the memory cell MC (or the selector element SE) and C is a capacitance component of the memory cell MC (or the selector element SE). The delay time provided by the delay circuit 53 may be set to be three times or less than the time constant expressed by RC, where R is a resistance component of both the memory cell MC (or the selector element SE) and the word line WL and C is a capacitance component of both the memory cell MC (or the selector element SE) and the word line WL.

The precharge switch S1 is a switch that switches between the supply of the precharge voltage Vpc to the memory cell MC and the stopping of the supply of that precharge voltage Vpc, under the control of the control circuit 13. The precharge switch S1 is coupled between the word line WL (or the memory cell MC) and the power supply circuit 51. Under the control circuit 13, the precharge switch S1 is set to either a coupled state (or a closed state) or a decoupled state (or an open state) between the word line WL and the power supply circuit 51. For example, when the precharge switch S1 is set to the coupled state, a precharge voltage Vpc is supplied from the power supply circuit 51 to the memory cell MC. On the other hand, when the precharge switch S1 is set to the decoupled state, the supply of the precharge voltage Vpc from the power supply circuit 51 to the memory cell MC is stopped. The precharge switch S1 includes, for example, an n-type MOS field effect transistor.

The sink switch S2 is a switch that, based on the output signal of the delay circuit 53, switches between discharging the charge from the memory cell MC and stopping that discharging. The sink switch S2 is coupled between the bit line BL (or the memory cell MC) and the ground voltage VSS node. The sink switch S2 sets the bit line BL and the ground voltage VSS node to either a coupled state or a decoupled state, based on the output signal of the delay circuit 53. For example, when the sink switch S2 is set to a coupled state, a discharge current flows from the memory cell MC to the ground voltage VSS node, and the charge in the memory cell MC is discharged. On the other hand, when the sink switch S2 is set to a decoupled state, no discharge current flows from the memory cell MC to the ground voltage VSS node, and the discharge of the memory cell MC is stopped. The sink switch S2 includes, for example, an n-type MOS field effect transistor.

The sense amplifier switch S3 is set to a decoupled state when data is read from the memory cell MC, based on the output signal of the delay circuit 53. On the other hand, when data is not read from the memory cell MC, the sense amplifier switch S3 is set to a coupled state. The sense amplifier switch S3 is coupled between the word line WL (or memory cell MC) and the sense amplifier SA. The sense amplifier switch S3 sets the word line WL and the sense amplifier SA to either a coupled state or a decoupled state, based on the output signal of the delay circuit 53. The sense amplifier switch S3 includes, for example, an n-type MOS field effect transistor.

It should be noted that the relationship between the input and output of the positive input terminal and the negative input terminal of the comparator CP, the number of inverters included in the delay circuit 53, and the polarity of the voltage at which the precharge switch S1, the sink switch S2 and the sense amplifier switch S3 are set to a coupled state or a decoupled state can be determined arbitrarily as long as the configuration enables the operation. For example, if the relationship between the input and output of the positive input terminal and the negative input terminal of the comparator CP is reversed, the number of inverters of the delay circuit 53 is set to be an odd number.

2. Read Operation of Magnetic Memory Device

A read operation of the magnetic memory device 1 of the embodiment will be described with reference to FIG. 7. FIG. 7 is a diagram showing changes in voltage of the memory cell MC during the read operation of the magnetic memory device 1. In FIG. 7, the horizontal axis represents time and the vertical axis represents the voltage Vm of the memory cell MC. The voltage Vm of the memory cell MC is a voltage charged (or held) in the memory cell MC (or the selector element SE) and the word line WL, and is the voltage obtained by subtracting the voltage of the bit line BL from the voltage of the word line WL.

A description will be given of a case where data stored in two memory cells MCa and MCb is read. The memory cells MCa and MCb may be the same memory cell that is read in different read cycles, or may be different memory cells coupled to different word lines. The read operation is controlled by the control circuit 13 or the read circuit 17.

When the memory cell MCa is read, the read circuit 17 charges the memory cell MCa to a precharge voltage Vpc, and then discharges the charge stored in the memory cell MCa. The time at which the voltage Vm of the memory cell MCa drops from voltage Vpc to voltage Va (i.e., time $t2a$) is detected as the time at which discharge starts (i.e., discharge start timing). The read circuit 17 reads the memory cell MCa after a predetermined delay time (or discharge time) A has elapsed from the discharge start timing (i.e., time $t3a$).

When the memory cell MCb is read, the read circuit 17 charges the memory cell MCb to a precharge voltage Vpc, and then discharges the charge stored in the memory cell MCb. The time at which the voltage Vm of the memory cell MCb drops from voltage Vpc to voltage Va (i.e., time $t2b$) is detected as the discharge start timing. The read circuit 17 reads the memory cell MCb after a predetermined delay time (or discharge time) B has elapsed from the discharge start timing (i.e., time $t3b$). The delay time B is equal to the delay time A.

The read circuit 17 adjusts the read execution time $t3a$ or $t3b$ such that the times from the discharge start time to the read execution time become equal, in accordance with the time $t2a$ at which the memory cell MCa starts the discharge or the time $t2b$ at which the memory cell MCb starts the discharge. This reduces a variation in the interval (or time) from the discharge start timing to the timing at which read is executed (hereinafter referred to as the read execution timing), the variation being caused by the variation in the discharge start timing, and enables the intervals from the discharge start timing to the read execution timing to become equal (or constant). Thus, the amounts of discharge current from memory cells in the same resistance state (high resistance state or low resistance state) can be made substantially equal, and read errors for memory cells in the same resistance state can be reduced.

The voltages of the memory cells MCa and MCb at times $t4a$ and $t4b$ shown in FIG. 7 are the hold voltage Vh described above. The hold voltage Vh is a voltage obtained when the sink switch S2 is kept coupled until the flow of the discharge current stops during the discharge after the memory cell MCa or MCb is charged to the precharge voltage Vpc. The hold voltages Vh of the memory cells MCa and MCb are approximately equal to each other.

The delay time A is set to a time (or interval) shorter than the time t2a-t4a. As described above, the time t2a is the discharge start timing in the memory cell MCa. The time t4a is the time at which the voltage Vm of the memory cell MCa reaches the hold voltage Vh.

Similarly, the delay time B is set to a time shorter than the time t2b-t4b. The time t2b is the discharge start timing in the memory cell MCb. The time t4b is the time at which the voltage Vm of the memory cell MCb reaches the hold voltage Vh.

The read operation of the magnetic memory device 1 of the embodiment will be described in detail with reference to FIG. 7 to FIG. 12. FIG. 8 is a flowchart illustrating the flow of the read operation of the magnetic memory device 1. FIG. 9 to FIG. 12 are diagrams showing the states of the switches and the flows of current during the read operation.

First, the read operation performed for the memory cell MCa will be described.

The read circuit 17 charges the memory cell MCa (and the word line WL) to a precharge voltage Vpc (S1). Specifically, as shown in FIG. 9, the control circuit 13 sets the precharge switch S1 and the sense amplifier switch S3 to coupled states (i.e., closed states) at time to, and sets the sink switch S2 to a decoupled state (i.e., open state). As a result, the precharge voltage Vpc is supplied from the power supply circuit 51 to the memory cell MCa (and the word line WL), and the memory cell MCa (and the word line WL) is charged to the precharge voltage Vpc.

Figure 11:
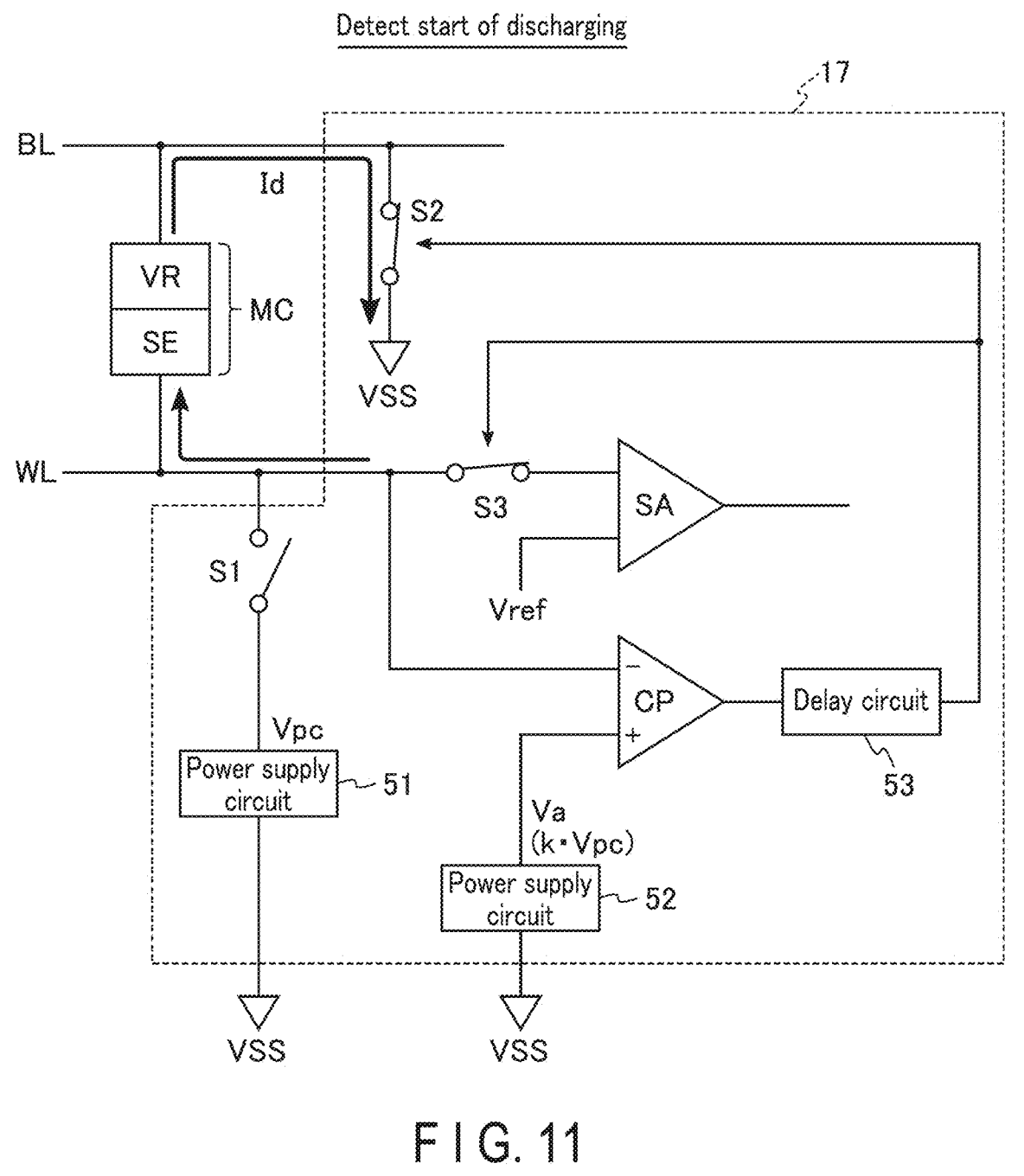

Next, the read circuit 17 starts discharging the precharge voltage Vpc charged in the memory cell MCa (and the word line WL) (S2). Specifically, as shown in FIG. 10, the read circuit 17 sets the precharge switch S1 to a decoupled state at time t1, and sets the sink switch S2 to a coupled state. The sense amplifier switch S3 is kept in the coupled state. This stops the supply of precharge voltage Vpc to the memory cell MCa (and word line WL). Thereafter, as shown in FIG. 11, a discharge current Id begins to flow from the memory cell MCa (and word line WL), and the voltage Vm of the memory cell MCa gradually decreases from the precharge voltage Vpc.

Then, the read circuit 17 detects the timing at which the voltage Vm of the memory cell MCa becomes lower than the voltage Va (i.e., the discharge start timing) (S3). Specifically, as shown in FIG. 11, the discharge current Id flows from the memory cell (and the word line WL) to the ground voltage VSS node via the bit line BL. Then, at time t2a, the comparator CP detects the discharge start timing at which the voltage Vm of the memory cell MCa becomes lower than the voltage Va. When the voltage Vm of the memory cell MCa becomes lower than the voltage Va, the comparator CP switches the output signal from "L" to "H" and outputs "H."

Figure 12:
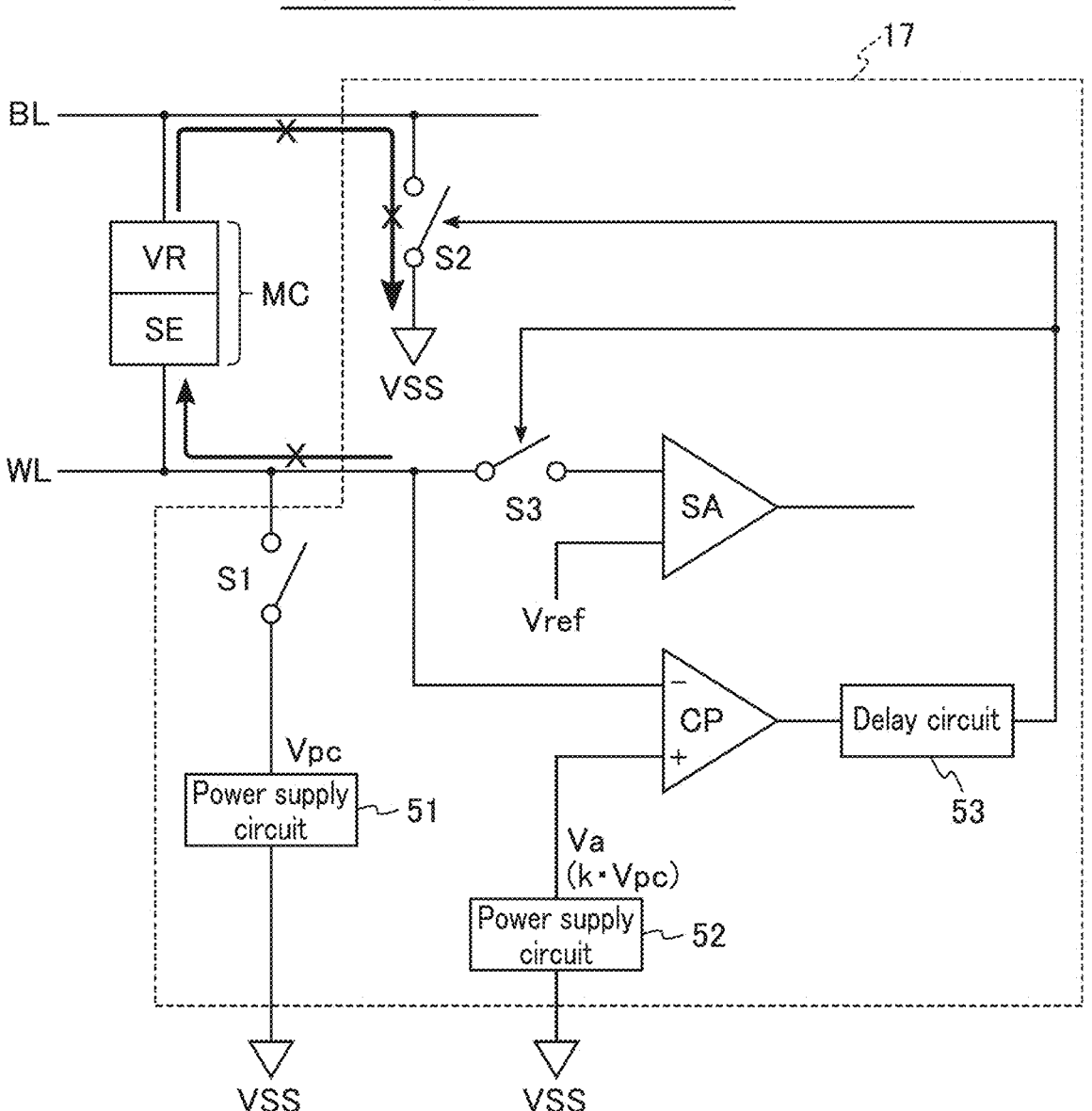

Then, the read circuit 17 stops discharging from the memory cell MCa (and the word line WL) after a predetermined delay time A has elapsed from the discharge start timing of the memory cell MCa (S4). Specifically, the output signal "H" of the comparator CP is input to the delay circuit 53. The delay circuit 53 delays the received signal "H" by a predetermined delay time A and outputs it to the control terminals of the sink switch S2 and the sense amplifier switch S3. As shown in FIG. 12, the sink switch S2 transitions from the coupled state to the decoupled state upon receipt of "H." Similarly, the sense amplifier switch S3 transitions from the coupled state to the decoupled state upon receipt of "H." Thus, at time t3a, discharging from the memory cell MCa (and the word line WL) is stopped, and the voltage Vm of the memory cell MCa at the time is held in the sense amplifier SA.

Furthermore, the read circuit 17 executes a read operation for the memory cell MCa (S5). Specifically, the sense amplifier SA compares the voltage Vm of the memory cell MCa at time t3a with the reference voltage Vref, and determines the data stored in the memory cell MCa, based on the comparison result.

Next, the read operation performed for the memory cell MCb will be described.

The read circuit 17 charges the memory cell MCb (and the word line WL) to the precharge voltage Vpc (S1). Specifically, as shown in FIG. 9, the control circuit 13 sets the precharge switch S1 and the sense amplifier switch S3 to coupled states at time to, and sets the sink switch S2 to a decoupled state. As a result, the precharge voltage Vpc is supplied from the power supply circuit 51 to the memory cell MCb (and the word line WL), and the memory cell MCb (and the word line WL) is charged to the precharge voltage Vpc.

Next, the read circuit 17 starts discharging the precharge voltage Vpc charged in the memory cell MCb (and the word line WL) (S2). Specifically, as shown in FIG. 10, the read circuit 17 sets the precharge switch S1 to a decoupled state at time t1, and sets the sink switch S2 to a coupled state. The sense amplifier switch S3 is kept in the coupled state. This stops the supply of precharge voltage Vpc to the memory cell MCb (and word line WL). Thereafter, as shown in FIG. 11, a discharge current Id begins to flow from the memory cell MCb (and word line WL), and the voltage Vm of the memory cell MCb gradually decreases from the precharge voltage Vpc.

Next, the read circuit 17 detects the discharge start timing at which the voltage Vm of the memory cell MCb becomes lower than the voltage Va (S3). Specifically, as shown in FIG. 11, the discharge current Id flows from the memory cell (and the word line WL) to the ground voltage VSS node via the bit line BL. Then, at time t2b, the comparator CP detects the discharge start timing at which the voltage Vm of the memory cell MCb becomes lower than the voltage Va. When the voltage Vm of the memory cell MCb becomes lower than the voltage Va, the comparator CP switches the output signal from "L" to "H" and outputs "H."

Then, the read circuit 17 stops discharging from the memory cell MCb (and the word line WL) after a predetermined delay time B has elapsed from the discharge start timing of the memory cell MCb (S4). Specifically, the output signal "H" of the comparator CP is input to the delay circuit 53. The delay circuit 53 delays the received signal "H" by a predetermined delay time B and outputs it to the control terminals of the sink switch S2 and the sense amplifier switch S3. As shown in FIG. 12, the sink switch S2 transitions from the coupled state to the decoupled state upon receipt of "H." Similarly, the sense amplifier switch S3 transitions from the coupled state to the decoupled state upon receipt of "H." Thus, at time t3b, discharging from the memory cell MCb (and the word line WL) is stopped, and the voltage Vm of the memory cell MCb at the time is held in the sense amplifier SA.

Furthermore, the read circuit 17 executes a read operation for the memory cell MCb (S5). Specifically, the sense amplifier SA compares the voltage Vm of the memory cell MCb at time t3b with the reference voltage Vref, and determines the data stored in the memory cell MCb, based on the comparison result.

As described above, the read circuit 17 adjusts the read execution timing to time t3a or t3b in accordance with the discharge start timing of the memory cell MCa (timing t2a) or the discharge start timing of the memory cell MCb (time t2*b*). This reduces a variation in the delay time (or discharge time) from the discharge start timing to the read execution timing, the variation being caused by a variation in the discharge start timing. Thus, the discharge times from the discharge start timing to the read execution timing in the memory cells MCa and MCb can be made approximately equal.

3. Advantages of Embodiment

The magnetic memory device 1 of the embodiment can reduce read errors in a read operation and improve the operating performance.

The advantages of the embodiment will be described below.

For example, when a memory cell of a magnetic memory device is read, a command is issued to start discharging the voltage stored in the memory cell. The time from issuing the discharge start command to the actual start of discharging from the memory cell can vary depending on the read cycle or the specific memory cell being read. On the other hand, the time from issuing the discharge start command until the execution of reading is set to a constant value. For this reason, even if the variable resistance element is in the same resistance state (either the high resistance state or the low resistance state), the read voltage of the memory cell will vary depending on the timing at which the memory cell actually starts discharging. For this reason, a read error may occur.

On the other hand, the embodiment includes circuitry, such as the comparator CP and the power supply circuit 52, that detects the discharge start timing in the memory cell MC (and word line WL), and the delay circuit 53, which delays a detection signal of the discharge start timing by a predetermined delay time (or discharge time). Thus, the timing of the read operation can be set after a predetermined delay time has elapsed from the timing when the target memory cell MC actually starts discharging. Therefore, even if the discharge start timing in the memory cell MC varies, the discharge time from the actual discharge start to the read operation can be set to a constant value. This can reduce read errors in the read operation and improve the operating performance.

In the embodiment, the cumulative amount of current flowing through the variable resistance element (e.g., MTJ element) VR of the memory cell MC during the read operation can be reduced, so that read disturb can be suppressed.

In addition, in the embodiment, the cumulative amount of current flowing to the variable resistance element VR can be reduced as described above, so that the current load on the variable resistance element VR can be reduced during the read operation, and the lifespan of the variable resistance element VR can be extended until it becomes worn out.

Furthermore, in the embodiment, the discharge current Id is stopped midway during the read operation after the memory cell MC (and the word line WL) is charged to the precharge voltage Vpc. This allows the read operation to be completed in a shorter time compared to the case where the discharge current is not stopped and the voltage of the memory cell MC has to reach the hold voltage Vh before reading.

As described above, the magnetic memory device 1 of the embodiment can improve the operating performance.

4. Others

In the present specification, the term "coupling" means that elements are electrically coupled, and does not exclude the case where another element is interposed in between. The non-magnetic layer 41 may be referred to as an "oxide layer." The elements contained in each layer of the MTJ element can be measured, for example, by electron energy loss spectroscopy (EELS) using a scanning transmission electron microscope (STEM).

While certain embodiments have been described, these embodiments have been presented by way of example only, and are not intended to limit the scope of the embodiments. Indeed, these embodiments can be embodied in a variety of other forms; furthermore, various omissions, substitutions and changes in the form of the embodiments described herein may be made without departing from the spirit. The accompanying claims and their equivalents are intended to cover such forms or modifications as would fall within the scope and spirit.

What is claimed is:

1. A magnetic memory device comprising:
a memory cell including a variable resistance element and a selector element;
a first power supply circuit configured to supply the memory cell with a first voltage;
a first switch that is coupled between the memory cell and the first power supply circuit and that sets the memory cell and the first power supply circuit to either a coupled state or a decoupled state;
a second switch that is coupled between the memory cell and a ground voltage node to which a ground voltage is supplied, and that sets the memory cell and the ground voltage node to either a coupled state or a decoupled state;
a comparator configured to compare a voltage of the memory cell with a second voltage lower than the first voltage, and to output a first signal when the voltage of the memory cell drops below the second voltage;
a delay circuit configured to delay the first signal output from the comparator by a first delay time and to output a second signal;
a sense amplifier configured to compare the voltage of the memory cell with a third voltage; and
a third switch that is coupled between the memory cell and the sense amplifier and that sets the memory cell and the sense amplifier to either a coupled state or a decoupled state,
wherein, during a read operation,
the first switch is set to a coupled state, the second switch is set to a decoupled state, and the memory cell is charged to the first voltage,
after the memory cell is charged to the first voltage, the first switch is set to a decoupled state, the second switch is set to a coupled state, and charge stored in the memory cell is discharged, and
in response to the second signal, the third switch is set to a decoupled state, and the sense amplifier compares the voltage of the memory cell with the third voltage to determine data stored in the memory cell.

2. The magnetic memory device according to claim 1, wherein in response to the second signal, the second switch is set to a decoupled state, and discharging of the charge stored in the memory cell is stopped.

3. The magnetic memory device according to claim 1, wherein
after the memory cell is charged to the first voltage, the second switch is set to a coupled state, and in a case where a voltage retained by the memory cell when the charge stored in the memory cell is discharged and discharging is stopped is referred to as a fourth voltage, the second voltage is lower than the first voltage and is higher than the fourth voltage.

4. The magnetic memory device according to claim 3, wherein the first delay time set by the delay circuit is shorter than a time required from output of the first signal from the comparator to a point in time when the memory cell drops to the fourth voltage due to the discharge.

5. The magnetic memory device according to claim 1, wherein in a case where a resistance component of the memory cell is R and a capacitance component thereof is C, the first delay time set by the delay circuit is three times or less than a time constant expressed by RC.

6. The magnetic memory device according to claim 1, further comprising a first interconnect and a second interconnect, wherein the memory cell is coupled between the first interconnect and the second interconnect, the first interconnect is coupled to the first switch, the second interconnect is coupled to the second switch, and the voltage of the memory cell includes a voltage held by the first interconnect.

7. The magnetic memory device according to claim 6, wherein in a case where a resistance component of both the memory cell and the first interconnect is R and a capacitance component thereof is C, the first delay time set by the delay circuit is three times or less than a time constant expressed by RC.

8. The magnetic memory device according to claim 1, wherein in a read operation performed for a first memory cell and a second memory cell, and in a case where a time from the comparator comparing a voltage of the first memory cell with the second voltage and outputting a first signal until the third switch is set to a decoupled state is defined as a first time, and a time from the comparator comparing a voltage of the second memory cell with the second voltage and outputting a first signal until the third switch is set to a decoupled state is defined as a second time, the first time and the second time are equal to each other.

9. The magnetic memory device according to claim 1, further comprising a first interconnect extending in a first direction and coupled to the selector element; and a second interconnect extending in a second direction intersecting the first direction and coupled to the variable resistance element, wherein the first switch is coupled between the first interconnect and the first power supply circuit, the second switch is coupled between the second interconnect and the ground voltage node, in a case where the first switch is set to a coupled state, the first voltage is supplied from the first power supply circuit to the selector element and the first interconnect, thereby charging the selector element and the first interconnect to the first voltage, and in a case where the second switch is set to a coupled state, charge stored in the selector element and the first interconnect is discharged through the second interconnect.

10. The magnetic memory device according to claim 1, wherein the selector element includes a bidirectional diode.

11. The magnetic memory device according to claim 1, wherein the first switch, the second switch, and the third switch each include a MOS field effect transistor.

12. The magnetic memory device according to claim 1, wherein the delay circuit includes an even number of inverters coupled in series.

13. The magnetic memory device according to claim 1, wherein the delay circuit includes a first inverter, a second inverter, and a resistive element and a capacitive element coupled between the first inverter and the second inverter.

14. The magnetic memory device according to claim 1, wherein the variable resistive element includes a magnetic tunnel junction (MTJ) element.

15. The magnetic memory device according to claim 14, wherein the MTJ element includes a first ferromagnetic layer, a second ferromagnetic layer, and a non-magnetic layer provided between the first ferromagnetic layer and the second ferromagnetic layer.

16. The magnetic memory device according to claim 15, wherein the first ferromagnetic layer contains at least one element selected from the group consisting of iron (Fe), cobalt (Co) and nickel (Ni), the non-magnetic layer contains at least one element, or an oxide of a compound thereof, selected from the group consisting of magnesium (Mg), aluminum (Al), zinc (Zn), titanium (Ti), and LSM (lanthanum-strontium-manganese), and the second ferromagnetic layer contains at least one element selected from the group consisting of iron (Fe), cobalt (Co) and nickel (Ni).

17. The magnetic memory device according to claim 15, wherein each of the first ferromagnetic layer and the second ferromagnetic layer has an easy magnetization axis direction perpendicular to a film surface, a magnetization direction of the first ferromagnetic layer is fixed, and a magnetization direction of the second ferromagnetic layer is configured to be easily reversed compared with that of the first ferromagnetic layer.

18. The magnetic memory device according to claim 1, further comprising:

a first conductive layer extending in a first direction; and a second conductive layer extending in a second direction intersecting the first direction and spaced apart from the first conductive layer, wherein the memory cell is provided between the first conductive layer and the second conductive layer.

* * * * *